United States Patent
Chapman et al.

(10) Patent No.: US 10,573,678 B2
(45) Date of Patent: Feb. 25, 2020

(54) MICROLENSES FOR HIGH DYNAMIC RANGE IMAGING PIXELS

(71) Applicant: SEMICONDUCTOR COMPONENTS INDUSTRIES, LLC, Phoenix, AZ (US)

(72) Inventors: Nathan Wayne Chapman, Middleton, ID (US); Marc Allen Sulfridge, Boise, ID (US); Ulrich Boettiger, Garden City, ID (US); Swarnal Borthakur, Boise, ID (US); Brian Anthony Vaartstra, Nampa, ID (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 43 days.

(21) Appl. No.: 15/974,942

(22) Filed: May 9, 2018

(65) Prior Publication Data

US 2019/0348456 A1    Nov. 14, 2019

(51) Int. Cl.
*H01L 27/146* (2006.01)
*G02B 3/00* (2006.01)

(52) U.S. Cl.
CPC ...... *H01L 27/14627* (2013.01); *G02B 3/0018* (2013.01); *G02B 3/0056* (2013.01); *H01L 27/14621* (2013.01); *H01L 27/14645* (2013.01); *H01L 27/14649* (2013.01)

(58) Field of Classification Search
CPC ......... H01L 27/14627; H01L 27/14645; H01L 27/14621; H01L 27/14649; G02B 13/0045; G02B 3/0018; G02B 3/0056
See application file for complete search history.

(56) References Cited

U.S. PATENT DOCUMENTS

| 2004/0223071 | A1 | 11/2004 | Wells et al. |
| 2009/0200623 | A1 | 8/2009 | Qian et al. |
| 2012/0249744 | A1 | 10/2012 | Pesach et al. |
| 2013/0033636 | A1 | 2/2013 | Pitts et al. |
| 2017/0347042 | A1* | 11/2017 | Borthakur .............. H04N 5/355 |

FOREIGN PATENT DOCUMENTS

WO    2017048425    3/2017

* cited by examiner

*Primary Examiner* — Jasmine J Clark
(74) *Attorney, Agent, or Firm* — Treyz Law Group, P.C.; Joseph F. Guihan

(57) ABSTRACT

An image sensor may include high dynamic range imaging pixels having an inner sub-pixel surrounded by an outer sub-pixel. To steer light away from the inner sub-pixel and towards the outer sub-pixel, the high dynamic range imaging pixels may be covered by a toroidal microlens. To mitigate cross-talk caused by high-angled incident light, various microlens arrangements may be used. A toroidal microlens may have planar portions on its outer perimeter. A toroidal microlens may be covered by four additional microlenses, each additional microlens positioned in a respective corner of the pixel. Each pixel may be covered by four microlenses in a 2×2 arrangement, with an opening formed by the space between the four microlenses overlapping the inner sub-pixel.

19 Claims, 11 Drawing Sheets

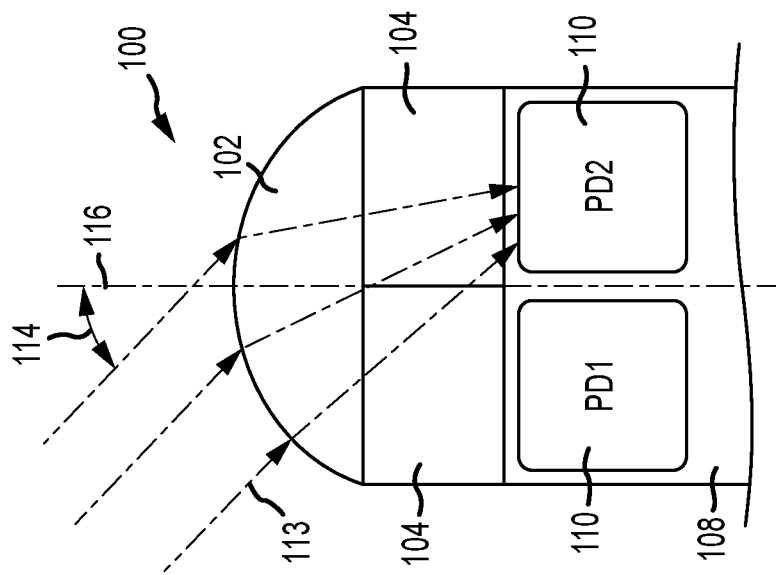
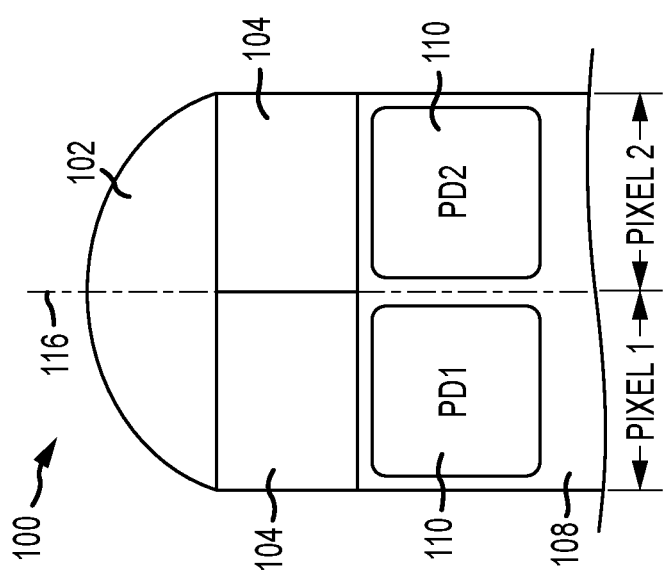

MICROLENSES FOR HIGH DYNAMIC RANGE IMAGING PIXELS

BACKGROUND

This relates generally to imaging systems and, more particularly, to imaging systems with high dynamic range functionalities.

Modern electronic devices such as cellular telephones, cameras, and computers often use digital image sensors. Imager sensors (sometimes referred to as imagers) may be formed from a two-dimensional array of image sensing pixels. Each pixel receives incident photons (light) and converts the photons into electrical signals. Each pixel is covered by a corresponding microlens. Image sensors are sometimes designed to provide images to electronic devices using a Joint Photographic Experts Group (JPEG) format.

Conventional imaging systems also may have images with artifacts associated with low dynamic range. Scenes with bright and dark portions may produce artifacts in conventional image sensors, as portions of the low dynamic range images may be over exposed or under exposed. Multiple low dynamic range images may be combined into a single high dynamic range image, but this typically introduces artifacts, especially in dynamic scenes.

It would therefore be desirable to be able to provide improved imaging systems with high dynamic range functionalities.

BRIEF DESCRIPTION OF THE DRAWINGS

FIG. 2A is a cross-sectional side view of illustrative phase detection pixels having photosensitive regions with different and asymmetric angular responses in accordance with an embodiment.

FIGS. 2B and 2C are cross-sectional views of the phase detection pixels of FIG. 2A in accordance with an embodiment.

DETAILED DESCRIPTION

Embodiments of the present invention relate to image sensors with pixels having high dynamic range functionality. These types of pixels may include two or more photosensitive areas for collecting light. Toroidal microlenses or other microlens groups may be used to direct light to the two or more photosensitive areas. The toroidal microlenses may be shaped to direct light to the corners of the pixel to mitigate cross-talk at high incident light angles. At high incident angles, the microlens shapes and arrangements discussed herein focus the light away from the boundary between adjacent pixels, thus mitigating the high angle light from crossing over into the adjacent pixel. The pixels covered by toroidal microlenses may also have phase detection functionality.

Figure 1:
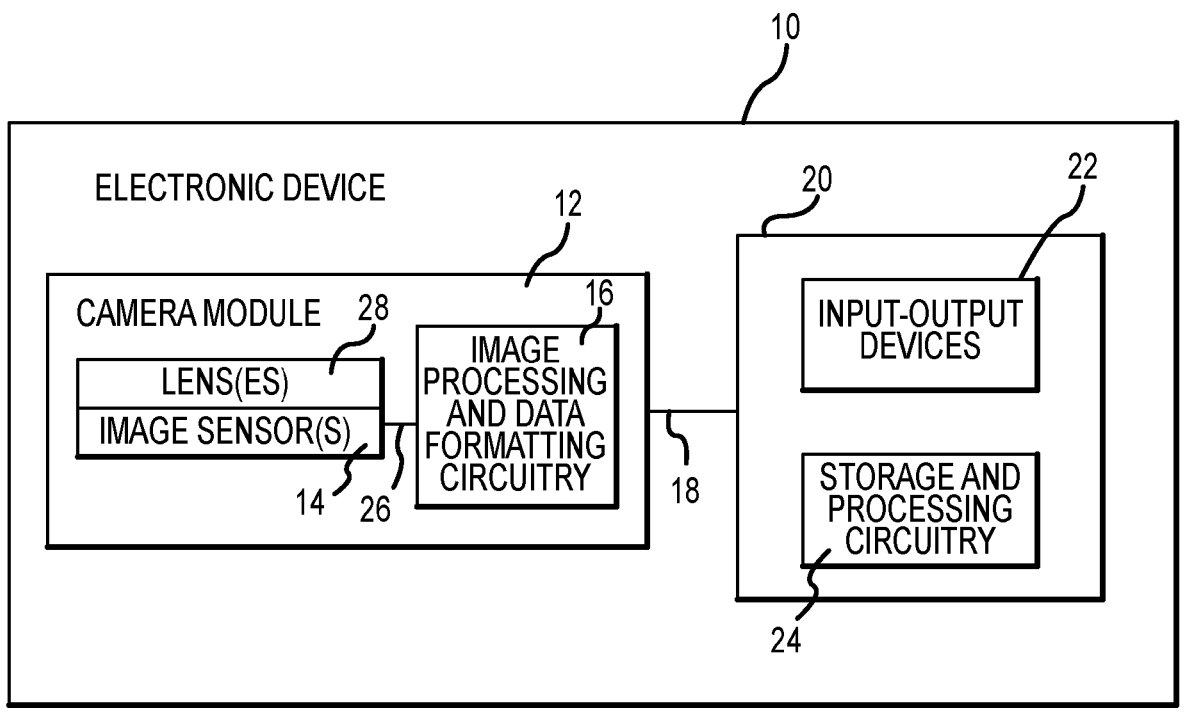
FIG. 1 is a schematic diagram of an illustrative electronic device with an image sensor that may include high dynamic range pixels in accordance with an embodiment.

An electronic device with a digital camera module is shown in FIG. 1. Electronic device 10 may be a digital camera, a computer, a cellular telephone, a medical device, or other electronic device. Camera module 12 (sometimes referred to as an imaging device) may include image sensor 14 and one or more lenses 28. During operation, lenses 28 (sometimes referred to as optics 28) focus light onto image sensor 14. Image sensor 14 includes photosensitive elements (e.g., pixels) that convert the light into digital data. Image sensors may have any number of pixels (e.g., hundreds, thousands, millions, or more). A typical image sensor may, for example, have millions of pixels (e.g., megapixels). As examples, image sensor 14 may include bias circuitry (e.g., source follower load circuits), sample and hold circuitry, correlated double sampling (CDS) circuitry, amplifier circuitry, analog-to-digital (ADC) converter circuitry, data output circuitry, memory (e.g., buffer circuitry), address circuitry, etc.

Still and video image data from image sensor 14 may be provided to image processing and data formatting circuitry 16 via path 26. Image processing and data formatting circuitry 16 may be used to perform image processing functions such as automatic focusing functions, depth sensing, data formatting, adjusting white balance and exposure, implementing video image stabilization, face detection, etc. For example, during automatic focusing operations, image processing and data formatting circuitry 16 may process data gathered by phase detection pixels in image sensor 14 to determine the magnitude and direction of lens movement (e.g., movement of lens 28) needed to bring an object of interest into focus.

Image processing and data formatting circuitry 16 may also be used to compress raw camera image files if desired (e.g., to Joint Photographic Experts Group or JPEG format). In a typical arrangement, which is sometimes referred to as a system on chip (SOC) arrangement, camera sensor 14 and image processing and data formatting circuitry 16 are implemented on a common integrated circuit. The use of a single integrated circuit to implement camera sensor 14 and image processing and data formatting circuitry 16 can help to reduce costs. This is, however, merely illustrative. If desired, camera sensor 14 and image processing and data formatting circuitry 16 may be implemented using separate integrated circuits. If desired, camera sensor 14 and image processing circuitry 16 may be formed on separate semiconductor substrates. For example, camera sensor 14 and image processing circuitry 16 may be formed on separate substrates that have been stacked.

Camera module 12 may convey acquired image data to host subsystems 20 over path 18 (e.g., image processing and data formatting circuitry 16 may convey image data to subsystems 20). Electronic device 10 typically provides a user with numerous high-level functions. In a computer or advanced cellular telephone, for example, a user may be provided with the ability to run user applications. To implement these functions, host subsystem 20 of electronic device 10 may include storage and processing circuitry 24 and input-output devices 22 such as keypads, input-output ports, joysticks, and displays. Storage and processing circuitry 24 may include volatile and nonvolatile memory (e.g., random-access memory, flash memory, hard drives, solid state drives, etc.). Storage and processing circuitry 24 may also include microprocessors, microcontrollers, digital signal processors, application specific integrated circuits, or other processing circuits. It may be desirable to provide image sensors with high dynamic range functionalities (e.g., to use in low light and high light environments to compensate for high light points of interest in low light environments and vice versa). To provide high dynamic range functionalities, image sensor 14 may include high dynamic range pixels.

It may be desirable to provide image sensors with depth sensing capabilities (e.g., to use in automatic focusing applications, 3D imaging applications such as machine vision applications, etc.). To provide depth sensing capabilities, image sensor 14 may include phase detection pixel groups such as phase detection pixel group 100 shown in FIG. 2A. If desired, pixel groups that provide depth sensing capabilities may also provide high dynamic range functionalities.

FIG. 2A is an illustrative cross-sectional view of pixel group 100. In FIG. 2A, phase detection pixel group 100 is a pixel pair. Pixel pair 100 may include first and second pixels such Pixel 1 and Pixel 2. Pixel 1 and Pixel 2 may include photosensitive regions such as photosensitive regions 110 formed in a substrate such as silicon substrate 108. For example, Pixel 1 may include an associated photosensitive region such as photodiode PD1, and Pixel 2 may include an associated photosensitive region such as photodiode PD2. A microlens may be formed over photodiodes PD1 and PD2 and may be used to direct incident light towards photodiodes PD1 and PD2. The arrangement of FIG. 2A in which microlens 102 covers two pixel regions may sometimes be referred to as a 2×1 or 1×2 arrangement because there are two phase detection pixels arranged consecutively in a line. In an alternate embodiment, three phase detection pixels may be arranged consecutively in a line in what may sometimes be referred to as a 1×3 or 3×1 arrangement. In other embodiments, phase detection pixels may be grouped in a 2×2 or 2×4 arrangement. In general, phase detection pixels may be arranged in any desired manner.

Color filters such as color filter elements 104 may be interposed between microlens 102 and substrate 108. Color filter elements 104 may filter incident light by only allowing predetermined wavelengths to pass through color filter elements 104 (e.g., color filter 104 may only be transparent to the wavelengths corresponding to a green color, a red color, a blue color, a yellow color, a cyan color, a magenta color, visible light, infrared light, etc.). Color filter 104 may be a broadband color filter. Examples of broadband color filters include yellow color filters (e.g., yellow color filter material that passes red and green light) and clear color filters (e.g., transparent material that passes red, blue, and green light). In general, broadband filter elements may pass two or more colors of light. Photodiodes PD1 and PD2 may serve to absorb incident light focused by microlens 102 and produce pixel signals that correspond to the amount of incident light absorbed.

Photodiodes PD1 and PD2 may each cover approximately half of the substrate area under microlens 102 (as an example). By only covering half of the substrate area, each photosensitive region may be provided with an asymmetric angular response (e.g., photodiode PD1 may produce different image signals based on the angle at which incident light reaches pixel pair 100). The angle at which incident light reaches pixel pair 100 relative to a normal axis 116 (i.e., the angle at which incident light strikes microlens 102 relative to the optical axis 116 of lens 102) may be herein referred to as the incident angle or angle of incidence.

An image sensor can be formed using front side illumination imager arrangements (e.g., when circuitry such as metal interconnect circuitry is interposed between the microlens and photosensitive regions) or backside illumination imager arrangements (e.g., when photosensitive regions are interposed between the microlens and the metal interconnect circuitry). The example of FIGS. 2A, 2B, and 2C in which pixels 1 and 2 are backside illuminated image sensor pixels is merely illustrative. If desired, pixels 1 and 2 may be front side illuminated image sensor pixels. Arrangements in which pixels are backside illuminated image sensor pixels are sometimes described herein as an example.

In the example of FIG. 2B, incident light 113 may originate from the left of normal axis 116 and may reach pixel pair 100 with an angle 114 relative to normal axis 116. Angle 114 may be a negative angle of incident light. Incident light 113 that reaches microlens 102 at a negative angle such as angle 114 may be focused towards photodiode PD2. In this scenario, photodiode PD2 may produce relatively high image signals, whereas photodiode PD1 may produce relatively low image signals (e.g., because incident light 113 is not focused towards photodiode PD1).

Figure 2C:
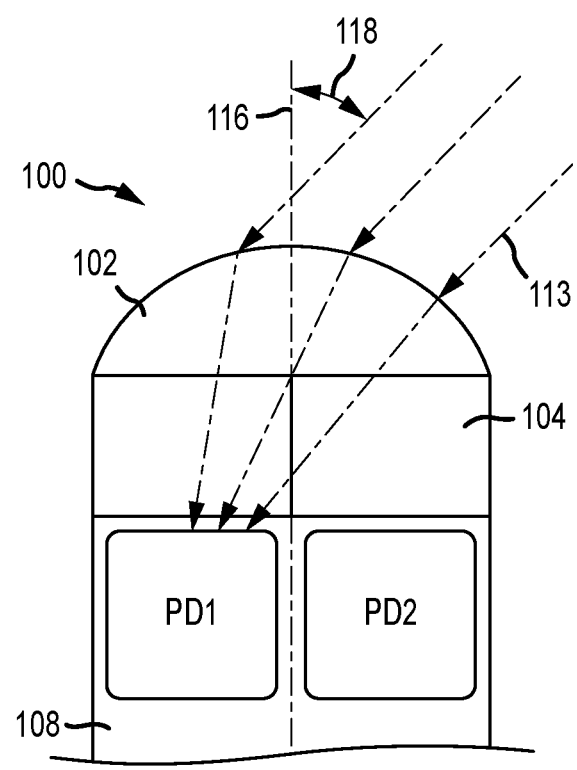

In the example of FIG. 2C, incident light 113 may originate from the right of normal axis 116 and reach pixel pair 100 with an angle 118 relative to normal axis 116. Angle 118 may be a positive angle of incident light. Incident light that reaches microlens 102 at a positive angle such as angle 118 may be focused towards photodiode PD1 (e.g., the light is not focused towards photodiode PD2). In this scenario, photodiode PD2 may produce an image signal output that is relatively low, whereas photodiode PD1 may produce an image signal output that is relatively high.

Figure 3:
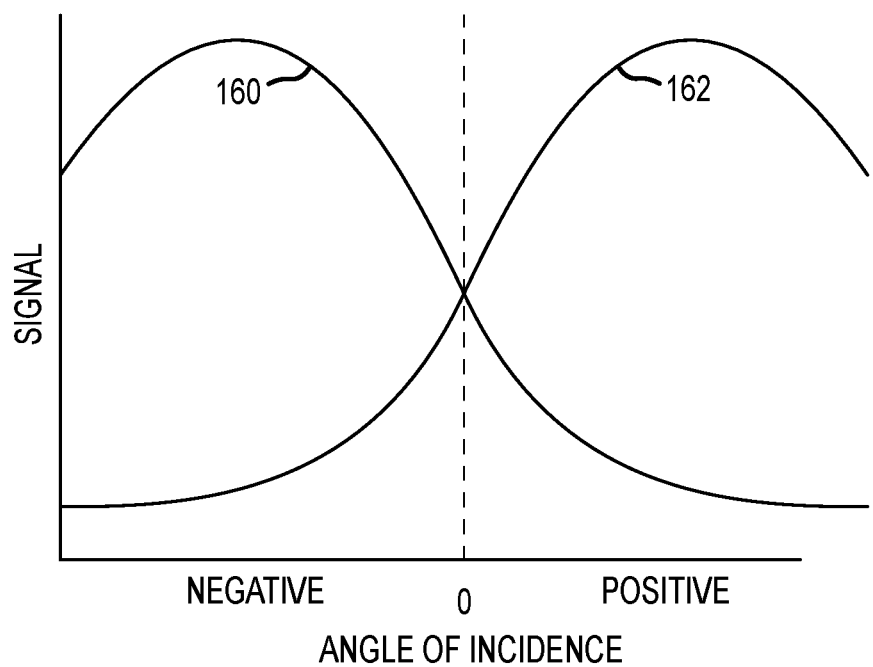
FIG. 3 is a diagram of illustrative signal outputs of photosensitive regions of depth sensing pixels for incident light striking the depth sensing pixels at varying angles of incidence in accordance with an embodiment.

The positions of photodiodes PD1 and PD2 may sometimes be referred to as asymmetric or displaced positions because the center of each photosensitive area 110 is offset from (i.e., not aligned with) optical axis 116 of microlens 102. Due to the asymmetric formation of individual photodiodes PD1 and PD2 in substrate 108, each photosensitive area 110 may have an asymmetric angular response (e.g., the signal output produced by each photodiode 110 in response to incident light with a given intensity may vary based on an angle of incidence). It should be noted that the example of FIGS. 2A-2C where the photodiodes are adjacent is merely illustrative. If desired, the photodiodes may not be adjacent (i.e., the photodiodes may be separated by one or more intervening photodiodes). In the diagram of FIG. 3, an example of the image signal outputs of photodiodes PD1 and PD2 of pixel pair 100 in response to varying angles of incident light is shown.

Line 160 may represent the output image signal for photodiode PD2 whereas line 162 may represent the output image signal for photodiode PD1. For negative angles of incidence, the output image signal for photodiode PD2 may increase (e.g., because incident light is focused onto photodiode PD2) and the output image signal for photodiode PD1 may decrease (e.g., because incident light is focused away from photodiode PD1). For positive angles of incidence, the output image signal for photodiode PD2 may be relatively small and the output image signal for photodiode PD1 may be relatively large.

The size and location of photodiodes PD1 and PD2 of pixel pair 100 of FIGS. 2A, 2B, and 2C are merely illustrative. If desired, the edges of photodiodes PD1 and PD2 may be located at the center of pixel pair 100 or may be shifted slightly away from the center of pixel pair 100 in any direction. If desired, photodiodes 110 may be decreased in size to cover less than half of the pixel area.

Output signals from pixel pairs such as pixel pair 100 may be used to adjust the optics (e.g., one or more lenses such as lenses 28 of FIG. 1) in image sensor 14 during automatic focusing operations. The direction and magnitude of lens movement needed to bring an object of interest into focus may be determined based on the output signals from pixel pairs 100.

For example, by creating pairs of pixels that are sensitive to light from one side of the lens or the other, a phase difference can be determined. This phase difference may be used to determine both how far and in which direction the image sensor optics should be adjusted to bring the object of interest into focus.

When an object is in focus, light from both sides of the image sensor optics converges to create a focused image. When an object is out of focus, the images projected by two sides of the optics do not overlap because they are out of phase with one another. By creating pairs of pixels where each pixel is sensitive to light from one side of the lens or the other, a phase difference can be determined. This phase difference can be used to determine the direction and magnitude of optics movement needed to bring the images into phase and thereby focus the object of interest. Pixel blocks that are used to determine phase difference information such as pixel pair 100 are sometimes referred to herein as phase detection pixels or depth-sensing pixels.

A phase difference signal may be calculated by comparing the output pixel signal of PD1 with that of PD2. For example, a phase difference signal for pixel pair 100 may be determined by subtracting the pixel signal output of PD1 from the pixel signal output of PD2 (e.g., by subtracting line 162 from line 160). For an object at a distance that is less than the focused object distance, the phase difference signal may be negative. For an object at a distance that is greater than the focused object distance, the phase difference signal may be positive. This information may be used to automatically adjust the image sensor optics to bring the object of interest into focus (e.g., by bringing the pixel signals into phase with one another).

As previously mentioned, the example in FIGS. 2A-2C where phase detection pixel block 100 includes two adjacent pixels is merely illustrative. In another illustrative embodiment, phase detection pixel block 100 may include multiple adjacent pixels that are covered by varying types of microlenses.

Figure 4:
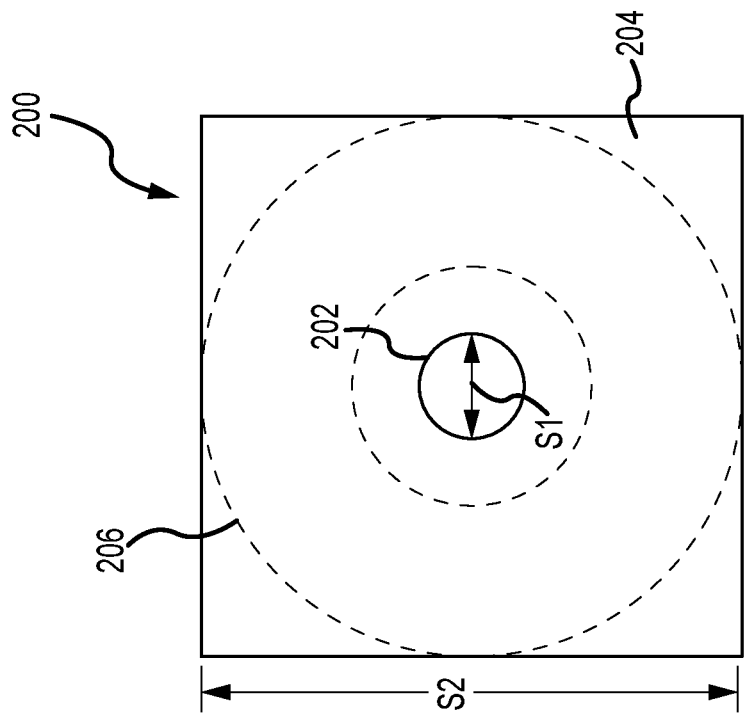
FIG. 4 is a top view of an illustrative pixel with an inner sub-pixel and an outer sub-pixel that is covered by a toroidal microlens in accordance with an embodiment.

FIG. 4 is a top view of an illustrative pixel that may be included in an image sensor such as image sensor 14. As shown, pixel 200 has at least two different light collecting areas (LCAs). Pixel 200 may include photodiodes with associated pixel circuitry used to capture the same spectrum of light. As an example, the pixels 200 may be used to capture red, green, blue, cyan, magenta, yellow, near-infrared, infrared, or any other spectrum of light. A single red, green, blue, cyan, magenta, yellow, near-infrared, infrared, or clear color filter may be formed over the pixel 200. In certain embodiments, the color filter formed over pixel 200 may have areas that pass colored light and areas that are clear (i.e., that pass visible or full-spectrum light outside the visible spectrum).

Pixel 200 of FIG. 4 may include a first sub-pixel 202, which may be referred to as the inner sub-pixel 202. Inner sub-pixel 202 may be completely surrounded by a second sub-pixel 204, which may be referred to as the outer sub-pixel 204. Inner sub-pixel 202 and outer sub-pixel 204 may correspond to n-type doped photodiode regions in a semiconductor substrate. There may be respective sub-pixel circuitry in the substrate such as transfer gates, floating diffusion regions, and reset gates of the pixel 200 that is coupled to the photodiode regions in the sub-pixels 202 and 204. The semiconductor substrate (not shown) may be a bulk p-type substrate made of silicon, or any other suitable semiconductor material.

A photodiode in inner sub-pixel 202 may have a circular shape at the surface. In other words, the light collecting area of inner sub-pixel 202 is a circular region. At the surface, the inner sub-pixel 202 may have a diameter S1. As an example, the diameter S1 of a photodiode in inner sub-pixel 202 may be 1 micron, but may alternatively be any other dimension without departing from the scope of the present embodiment. Outer sub-pixel 204 may have a square outer boundary and a circular inner boundary at the surface. The area enclosed by the square outer boundary and circular inner boundary of outer sub-pixel 204 shown in FIG. 4 may correspond to the light collecting area of outer sub-pixel 204. As shown in FIG. 4, the length of one of the sides of outer sub-pixel 204 is S2. As an example, S2 may be 3 microns, but may alternatively be any other dimension without departing from the scope of the present embodiment. The length S2 is preferably greater than the length S1. Outer sub-pixel 204 is illustrated in FIG. 4 as having a square outer boundary but may alternatively have a rectangular outer boundary or an outer boundary of any other desired shape (e.g., a curved outer boundary such as a circular outer boundary).

If desired an optional isolation region may be formed between inner sub-pixel 202 and outer sub-pixel 204. The isolation region may separate individual sub-pixels in a given pixel from one another, and may also separate individual sub-pixels in different respective pixels from one another. The optional isolation region may be formed from different types of isolation devices such as trench isolation structures, doped semiconductor regions, metallic barrier structures, or any other suitable isolation device.

Because inner sub-pixel 202 is surrounded by outer sub-pixel 204, inner sub-pixel 202 may sometimes be described as being nested within outer sub-pixel 204. Pixel 200 may sometimes be referred to as a nested image pixel. The inner sub-pixel group and the outer sub-pixel group in a nested image pixel may have the same geometric optical centers. In other words, because the outer sub-pixel group surrounds the inner sub-pixel group symmetrically, the center of the surface of the inner sub-pixel group is the same as the center of the outer sub-pixel group that surrounds the inner sub-pixel group.

The inner sub-pixel 202 may have a lower sensitivity to incident light and may be referred to as having a lower sensitivity light collecting area compared to outer sub-pixel 204. The respective doping concentrations of inner sub-pixel 202 and outer sub-pixel 204 may be different or they may be the same. As an example, the doping concentrations of photodiode regions in inner sub-pixel 202 may be modified to reduce the sensitivity of inner sub-pixel 202 to light. However, for the sake of simplicity in explaining and highlighting the properties of the pixel 200, it will be assumed that the sub-pixels 202 and 204 have photodiodes with the same doping concentrations. The lower sensitivity to incident light of inner sub-pixel 202 compared to outer sub-pixel 204 may be a result of the lower light collecting area of inner sub-pixel 202 compared to the light collecting area of outer sub-pixel 204.

Inner sub-pixel 202 may sometimes be referred to as inner photodiode 202 or inner photosensitive area 202. Similarly, outer sub-pixel 204 may sometimes be referred to as outer photodiode 204 or outer photosensitive area 204.

The ratio of the light sensitivity of the outer sub-pixel group to the light sensitivity of the inner sub-pixel group may be at least 4 to 1, but could be 5 to 1, 10 to 1, any intermediate ratio, or any larger ratio. In other words, the light sensitivity of the outer sub-pixel group may be at least four times greater than the light sensitivity of the inner sub-pixel group.

One or more microlenses may be formed over the pixel 200 of FIG. 4 to direct light toward the outer sub-pixel 204. The one or more microlenses may be formed over the color filter formed over pixel 200. To direct light toward outer sub-pixel 204, the one or more microlenses may be formed over only outer sub-pixel 204. As shown in FIG. 4, microlens 206 is a toroidal microlens that covers outer sub-pixel 204. The toroidal microlens has an opening that overlaps inner sub-pixel 202 such that the microlens does not overlap inner sub-pixel 202. This enables light to be directed towards the outer sub-pixel. In some embodiments however, the one or more microlenses that direct light toward outer sub-pixel 204 may partially or completely overlap the light collecting area of sub-pixel 202. Directing light toward outer sub-pixel 204 may further increase the sensitivity of the light collecting area of outer sub-pixel 204 relative to the sensitivity of the light collecting area of inner sub-pixel 202. In some embodiments, inner sub-pixel 202 may optionally be covered by a microlens that is formed separately from microlens 206.

Because a larger amount of light incident on pixel 200 is directed to outer sub-pixel 204 than to inner sub-pixel 202, inner sub-pixel 202 is said to have a lower sensitivity light collecting area compared to outer sub-pixel 204. The difference in sensitivity to light of inner sub-pixel 202 and outer sub-pixel 204 enables pixel 200 to be used in high dynamic range applications while using the same integration time for each sub-pixel. If desired, the integration time for each sub-pixel may be different to further increase the dynamic range of the pixel.

Figure 5:
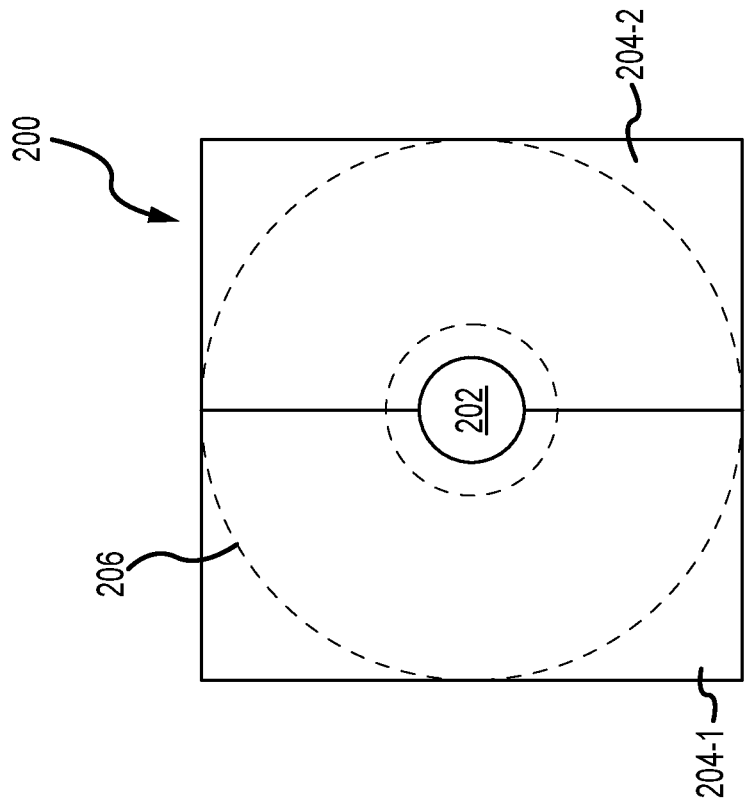
FIG. 5 is a top view of an illustrative pixel with an inner sub-pixel and a split outer sub-pixel group that is covered by a toroidal microlens in accordance with an embodiment.

It may be desirable to provide phase detection capabilities in a pixel of the type shown in FIG. 4. FIG. 5 shows an illustrative imaging pixel with high dynamic range functionality and phase detection capability. As shown in FIG. 5, pixel 200 may include an inner sub-pixel 202. Additionally, pixel 200 may include two outer sub-pixels 204-1 and 204-2. Sub-pixels 204-1 and 204-2 may sometimes collectively be referred to as outer sub-pixel group 204. By splitting the outer sub-pixel group 204 into two separate outer sub-pixels, the outer sub-pixel group may have phase detection capabilities (e.g., sub-pixels 204-1 and 204-2 may each have an asymmetric response to incident light). In FIGS. 4 and 5, toroidal microlens 206 is shown as not overlapping inner sub-pixel 202. This example is merely illustrative. If desired, toroidal microlens 206 may partially overlap inner sub-pixel 202. The microlens may divert light away from inner sub-pixel 202 towards outer sub-pixel group 204.

Figure 6:
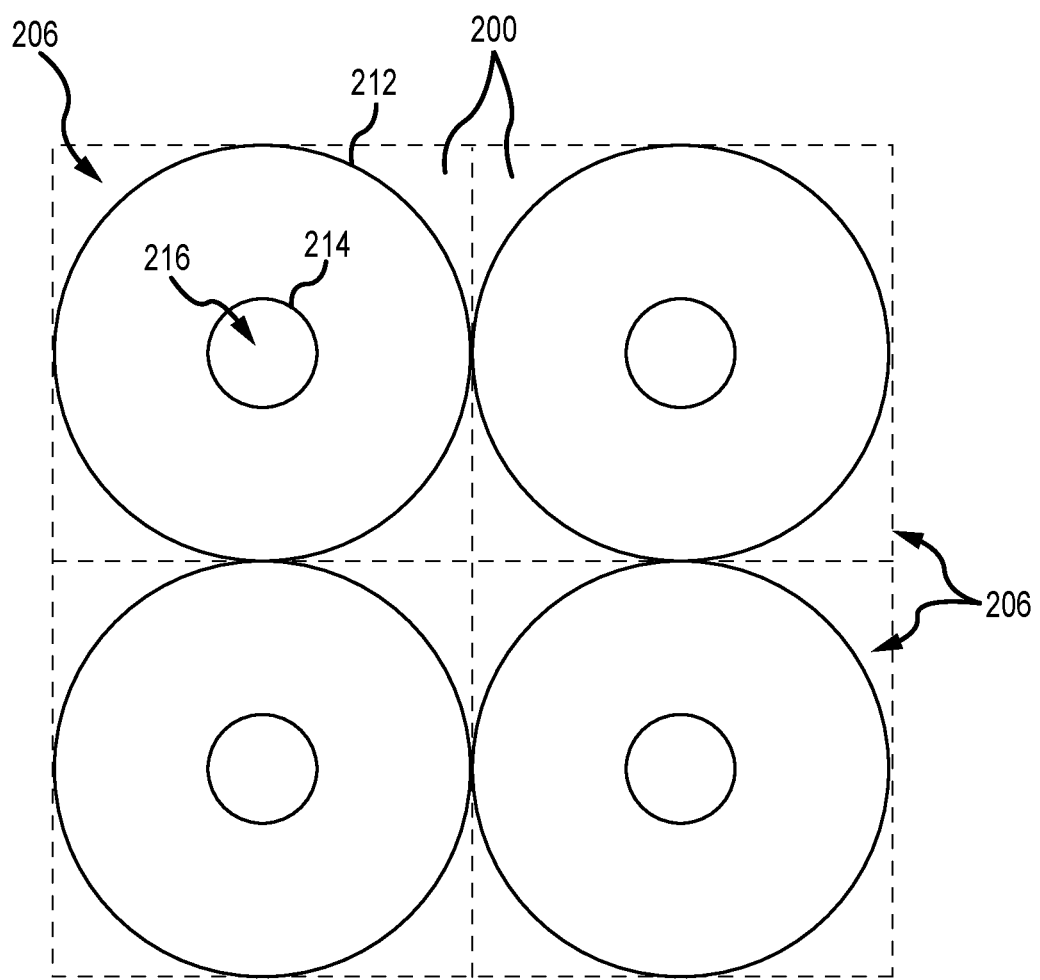
FIG. 6 is a top view of illustrative toroidal microlenses that may be used to cover pixels of the type shown in FIGS. 4 and 5 in accordance with an embodiment.

Toroidal microlenses 206 may be designed to steer most of the incoming light towards outer sub-pixel group 204 (e.g., to ensure a sufficient ratio of the light sensitivity of the outer sub-pixel group to the light sensitivity of the inner sub-pixel group). Illustrative toroidal microlenses 206 are shown in detail in FIG. 6. As shown in FIG. 6, each toroidal microlens 206 has an outer perimeter 212 and an inner perimeter 214. The inner perimeter 214 defines an opening 216 in the toroidal microlens. As previously discussed, opening 216 in toroidal microlens 206 may cover some or all of underlying inner sub-pixel 202.

In the embodiment of FIG. 6, toroidal microlenses 206 have a circular outer perimeter 212 and a circular inner perimeter 214. Additionally, each outer perimeter 212 fits within the boundary for the associated pixel 200 (indicated by the dashed lines). In other words, the microlenses are not merged together in FIG. 6. This example is merely illustrative. In practice, the microlenses may be merged together as shown in FIG. 7.

Figure 7:
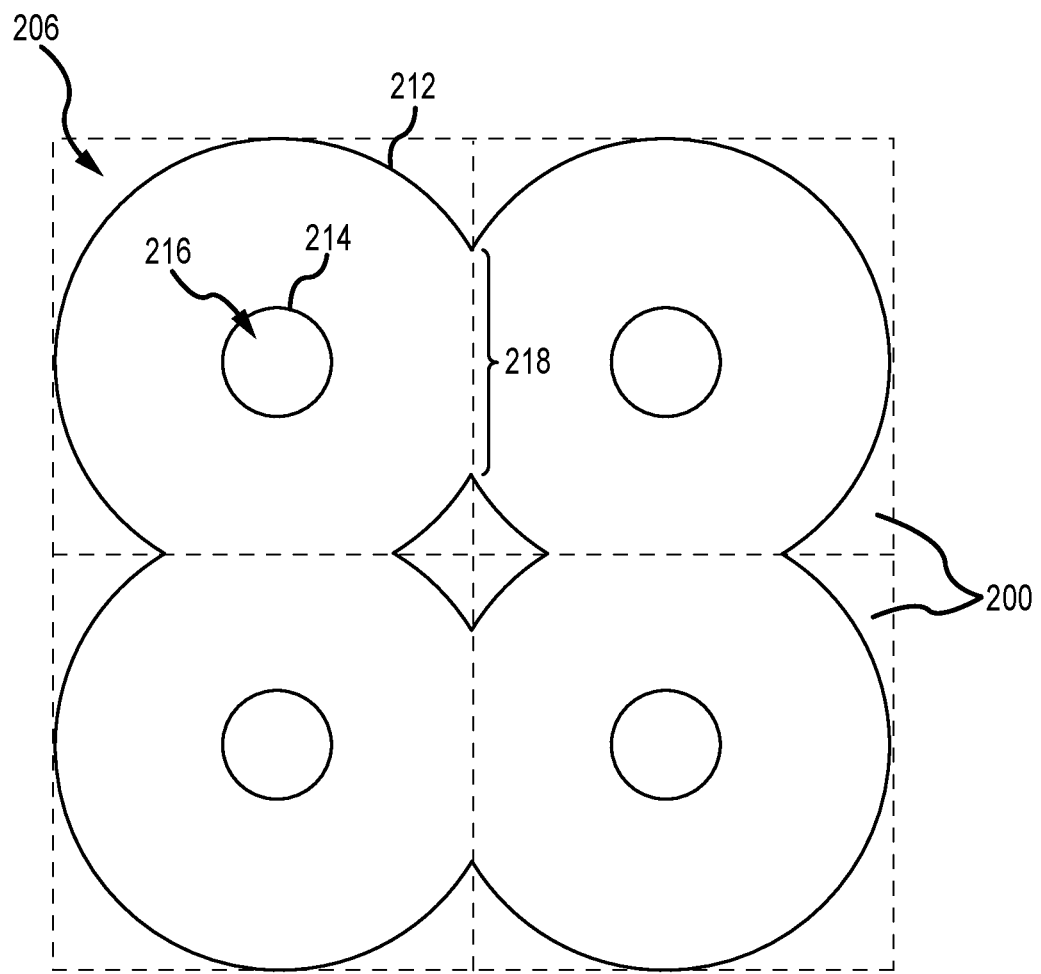
FIG. 7 is a top view of illustrative toroidal microlenses with merged portions that may be used to cover pixels of the type shown in FIGS. 4 and 5 in accordance with an embodiment.

In FIG. 7, each toroidal microlens again has a circular outer perimeter 212 and circular inner perimeter 214. However, adjacent toroidal microlenses are merged together (e.g., at interface 218). This allows each microlens to cover a greater area of its pixel 200. For simplicity, in subsequent descriptions herein the shape of outer perimeter 212 for each microlens will be described without considering the degree of merging with adjacent microlenses. For example, in FIG. 7 outer perimeter 212 is considered circular (even though the circle merges with an adjacent microlens).

The merging of the microlenses as shown in FIG. 7 may occur at various stages during manufacturing of the microlenses. In general, the microlenses may be formed by depositing and patterning a photoresist material (e.g., a photolithography process). After forming the photoresist pattern, the photoresist material is heated to a temperature at which the photoresist material softens and adopts a semispherical shape (or other shape with curved outer surfaces). The photoresist material may be only partially cured at this stage. Then, while the photoresist material has the desired curved outer surfaces, a final curing process (e.g., added UV irradiation or heat) may maintain the shape of the photoresist material. Heating the photoresist material to impart curvature may sometimes be referred to as a reflow process. In one embodiment, half of the microlenses (e.g., in a checkerboard pattern) may first be completely formed (e.g., patterned, heated, and cured). Each of these microlenses may have a circular outer perimeter, for example. Then, once the first half of the microlenses are complete, the second half of the microlenses may be formed in between the first half of the microlenses. The second half of the microlenses may contact and cover portions of the first half of the microlenses, forming merged interfaces 218 (e.g., merged interfaces 218 are formed after reflow and final curing of the first half of the microlenses). In an alternate embodiment, all of the microlenses may be formed in one process and a dry etch transfer process (for example with gases $CF_4$ and $C_4F_8$) may be used to reduce the gaps and create the shapes shown in the figures. In this type of embodiment, merged interfaces 218 are formed by the photoresist material of the microlenses merging during etch. For simplicity, in subsequent descriptions herein merged interfaces of either type may be considered a merged interface 218 between adjacent microlenses.

The example of FIGS. 6 and 7 of toroidal microlenses 206 having circular outer perimeters and circular inner perimeters is also merely illustrative. In general, toroidal microlenses may have any desired outer perimeter shape and inner perimeter shape. For example, to reduce cross-talk at high incident light angles, microlens arrangements of the type shown in FIGS. 8-11 may be used. To reduce cross-talk at high incident light angles, the microlenses may steer light towards the corners of the pixels.

Figure 8:
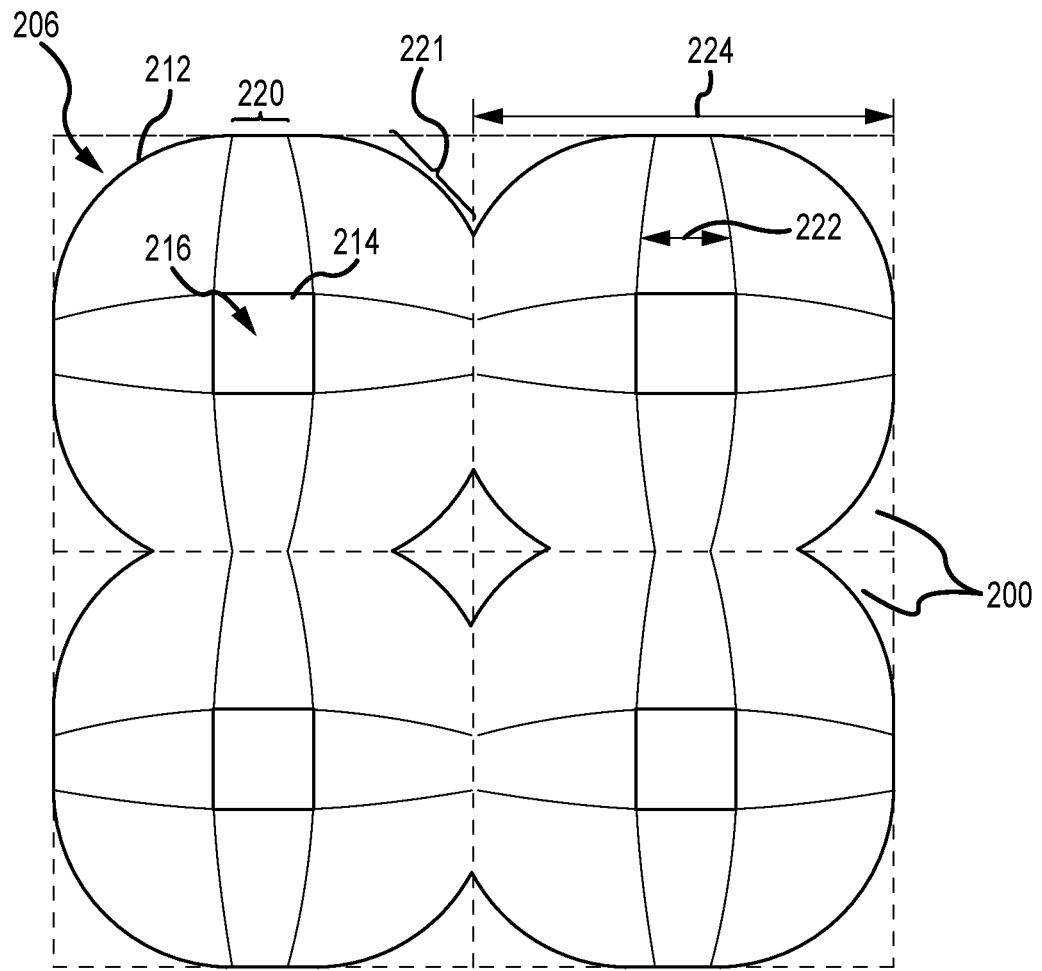
FIGS. 8 and 9 are top views of illustrative toroidal microlenses having outer perimeters with planar portions that may be used to cover pixels of the type shown in FIGS. 4 and 5 in accordance with an embodiment.

FIG. 8 is a top view of illustrative toroidal microlenses having planar outer perimeter portions. As shown in FIG. 8, microlenses 206 are squared on four sides. In other words, instead of outer perimeter 212 being circular, outer perimeter 212 has planar portions 220. Each microlens 206 has four planar portions 220. Curved portions (e.g., curved portion 221) of outer perimeter 212 are interposed between each respective pair of planar portions 220 of outer perimeter 212. Additionally, as shown in FIG. 8, inner perimeter 214 has a square shape instead of a circular shape. Inner perimeter 214 may have other desired shapes if desired (e.g., non-square rectangular). Squaring the sides of the microlenses may provide better light separation at high incident light angles compared to the microlenses of FIG. 7.

In FIG. 8, each planar portion 220 has a respective width 222. The width of the planar portion 220 at the outer perimeter 212 may be the same as or different from the width of the planar portion of inner perimeter 214. Each microlens may have an overall width 224. Width 222 may be any desired distance (e.g., less than 1 micron, less than 2 micron, less than 0.5 micron, less than 0.3 micron, less than 0.1 micron, greater than 1 micron, greater than 2 micron, greater than 0.5 micron, greater than 0.3 micron, greater than 0.1 micron, between 0.1 micron and 1.0 micron, between 0.2 and 0.5 micron, etc.). Width 222 may be any desired percentage of width 224 (e.g., less than 40%, less than 20%, less than 10%, less than 80%, less than 60%, less than 50%, greater than 40%, greater than 20%, greater than 10%, greater than 80%, greater than 60%, greater than 50%, between 10% and 30%, between 10% and 50%, between 10% and 90%, between 30% and 60%, between 25% and 75%, between 5% and 20%, etc.). The width shown in FIG. 8 is merely illustrative. If desired, a larger width for planar portions 220 may be used, as shown in FIG. 9.

Figure 9:
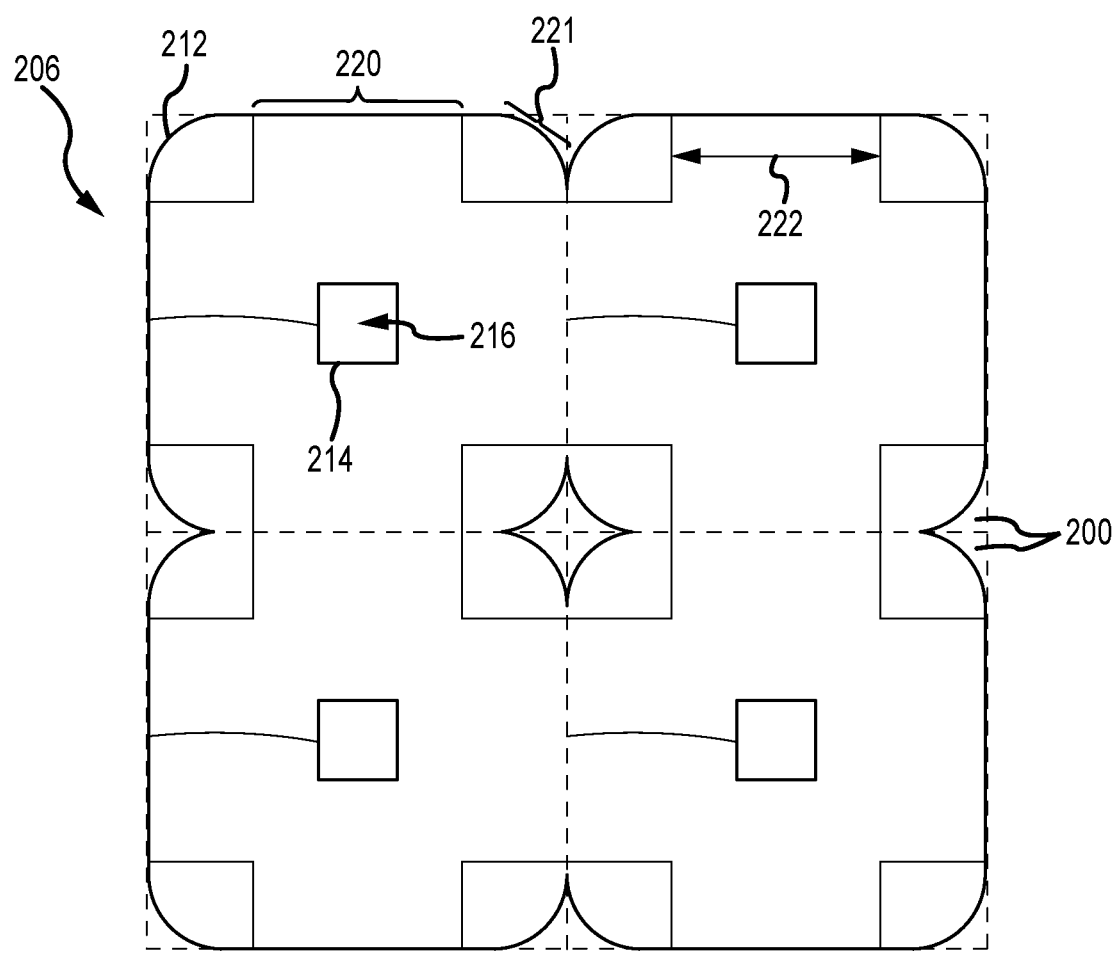

Microlenses 206 in FIGS. 8 and 9 may still be described as toroidal microlenses (even though outer perimeter 212 is not a perfect circle). Microlenses 206 may be referred to as toroidal microlenses 206, ring-shaped microlenses 206, donut-shaped microlenses 206, or annular microlenses 206.

Figure 10:
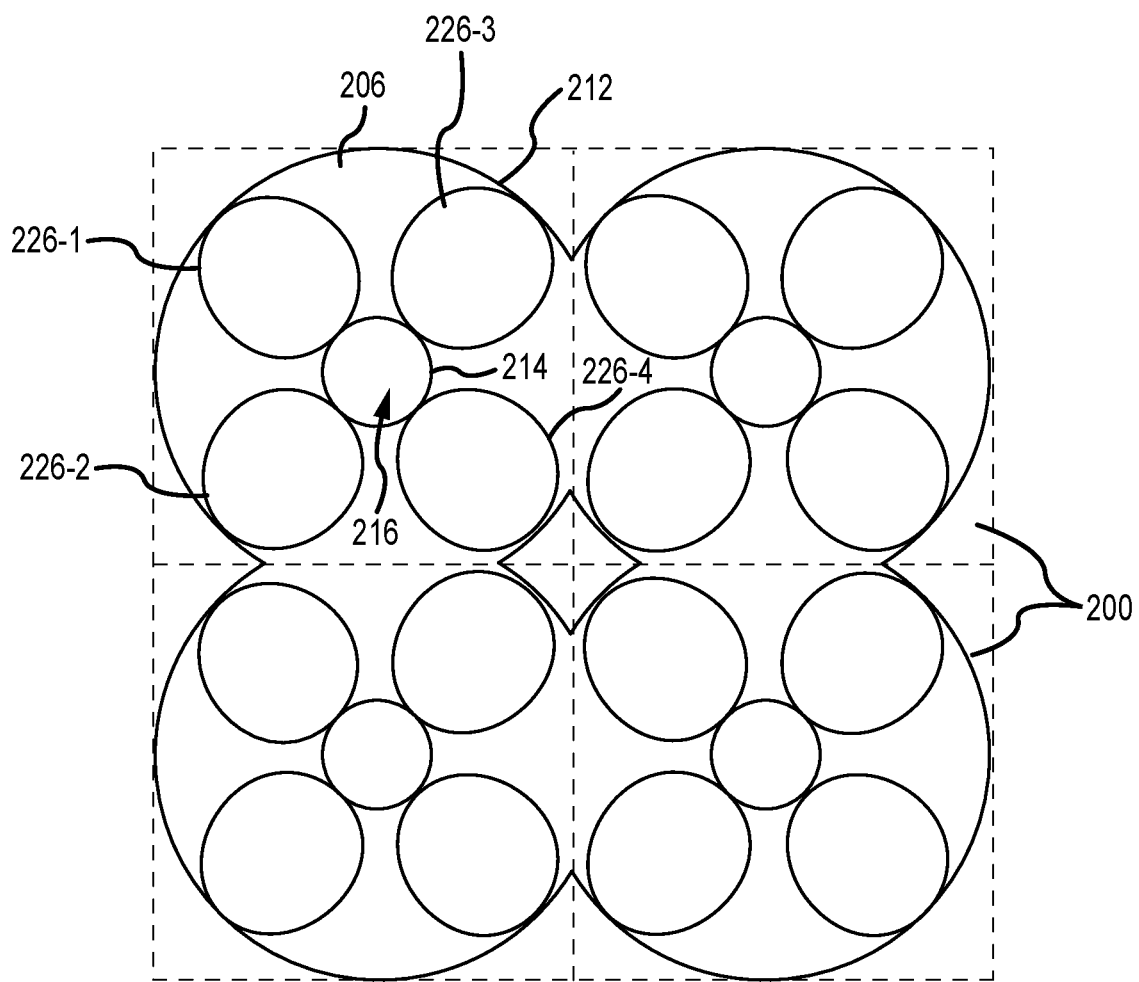
FIG. 10 is a top view of illustrative microlens groups that include a toroidal microlens covered by four additional microlenses and that may be used to cover pixels of the type shown in FIGS. 4 and 5 in accordance with an embodiment.

FIG. 10 shows another possible arrangement for microlenses over a pixel such as pixel 200 in FIG. 5 (with an inner sub-pixel group surrounded by an outer sub-pixel group). In FIG. 10, each pixel 200 is covered by more than one microlens. The microlenses covering a given pixel may be referred to as microlens group. Each microlens group includes a toroidal microlens 206 with an outer perimeter 212 and an inner perimeter 214. The inner perimeter 214 defines an opening 216 in the toroidal microlens. As previously discussed, opening 216 in toroidal microlens 206 may cover some or all of underlying inner sub-pixel 202. In the embodiment of FIG. 10, toroidal microlenses 206 have a circular outer perimeter 212 and a circular inner perimeter 214 (as in FIGS. 6 and 7). However, this example is merely illustrative, and microlenses 206 may have outer and/or inner perimeters with planar portions (as in FIGS. 8 and 9) if desired.

In addition to a toroidal microlens 206, each microlens group covering a given pixel in FIG. 10 includes four additional microlenses (226-1, 226-2, 226-3, and 226-4). A first microlens 226-1 is formed in the upper-left corner of the pixel over toroidal microlens 206, a second microlens 226-2 is formed in the lower-left corner of the pixel over toroidal microlens 206, a third microlens 226-3 is formed in the upper-right corner of the pixel over toroidal microlens 206, and a fourth microlens 226-4 is formed in the lower-right corner of the pixel over toroidal microlens 206. Microlenses 226-1, 226-2, 226-3, and 226-4 may be spherically shaped (e.g., may have a curved upper surface without an opening). Additional microlenses 226-1, 226-2, 226-3, and 226-4 may focus light on the corners of the pixels and reduce cross-talk. The arrangement of FIG. 10 of each of additional microlenses 226-1, 226-2, 226-3, and 226-4 being formed over a respective corner of toroidal microlens 206 is merely illustrative. In general, each microlens pixel group may include any desired number of additional microlenses (e.g., one, two, three, four, more than four, etc.) in any desired arrangement. Each additional microlens may have any desired shape.

The additional microlenses may be formed in any desired manner. As previously discussed, toroidal microlenses 206 may be formed in two separate photolithography processes (e.g., a first half of the toroidal microlenses are formed then a second half of the microlenses are formed). Additional microlenses 226-1, 226-2, 226-3, and 226-4 may then be formed over toroidal microlenses in a single photolithography process or multiple photolithography processes. Additional microlenses 226-1, 226-2, 226-3, and 226-4 may be patterned directly on toroidal microlenses 206 such that the addition microlenses are in direct contact with the toroidal microlenses.

Figure 11:
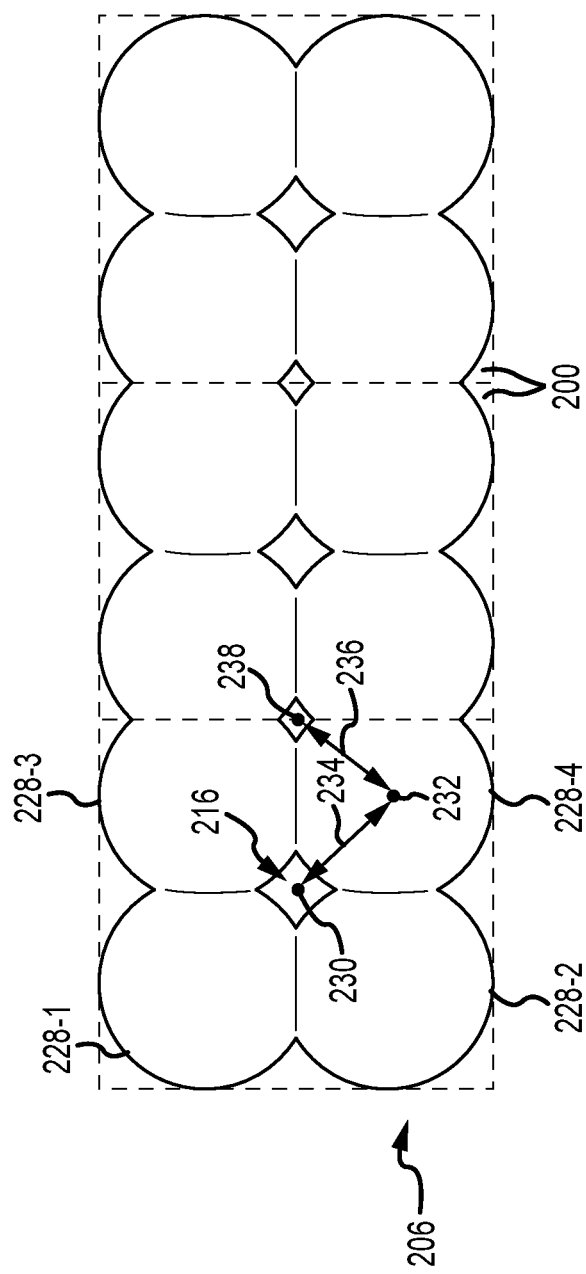
FIG. 11 is a top view of illustrative microlens groups that include four microlenses and that may be used to cover pixels of the type shown in FIGS. 4 and 5 in accordance with an embodiment.

FIG. 11 shows yet another possible arrangement for microlenses over a pixel such as pixel 200 in FIG. 5 (with an inner sub-pixel group surrounded by an outer sub-pixel group). As shown in FIG. 11, a toroidal microlens group may be formed from individual microlenses that do not have openings. Each pixel may be covered by four respective microlenses 228-1, 228-2, 228-3, and 228-4. The four respective microlenses may approximate the shape of a toroidal microlens 206 with a central opening 216 defined by the space between the four microlenses.

A first microlens 228-1 is formed in the upper-left corner of the pixel, a second microlens 228-2 is formed in the lower-left corner of the pixel, a third microlens 228-3 is formed in the upper-right corner of the pixel, and a fourth microlens 228-4 is formed in the lower-right corner of the pixel. Microlenses 228-1, 228-2, 228-3, and 228-4 may be spherically shaped (e.g., may have a curved upper surface without an opening). Microlenses 228-1, 228-2, 228-3, and 228-4 may focus light on the corners of the pixels and reduce cross-talk. The arrangement of FIG. 11 of each of microlenses 228-1, 228-2, 228-3, and 228-4 being formed over a respective corner of the pixel is merely illustrative. In general, each microlens group may include any desired number of microlenses (e.g., one, two, three, four, more than four, etc.) in any desired arrangement. Each microlens may have any desired shape.

Microlenses 228-1, 228-2, 228-3, and 228-4 may be shifted away from the center of their corresponding pixel 200. As shown, each pixel 200 has a center (e.g., a geometric center) 230 within the opening 216 between the microlenses. Each microlens has a respective center (e.g., geometric center) 232 that is separated from center 230 by a distance 234. Each microlens center 232 may also be separated from a point 238 between adjacent microlens groups (e.g., center 230 is the center of four adjacent microlenses within a single microlens group and point 238 is the center of four adjacent microlenses in different microlens groups). Because each microlens is shifted away from the center of the pixel, distance 234 is greater than distance 236.

In general, the microlenses 228-1, 228-2, 228-3, and 228-4 may be formed by depositing and patterning a photoresist material (e.g., a photolithography process). Then, reflow and final curing maintain the desired shape of the curved outer surfaces of the microlenses. In one embodiment, half of microlenses 228-1, 228-2, 228-3, and 228-4 (e.g., in a checkerboard pattern) may first be completely formed (e.g., patterned, heated, and cured). Each of these microlenses may have a circular perimeter, for example. Then, once the first half of the microlenses are complete, the second half of the microlenses may be formed in between the first half of the microlenses. The second half of the microlenses may contact and cover portions of the first half of the microlenses, forming merged interfaces (e.g., merged interfaces formed after reflow and final curing of the first half of the microlenses). In an alternate embodiment, all of microlenses 228-1, 228-2, 228-3, and 228-4 may be formed in one process and a dry etch transfer process (for example with gases $CF_4$ and $C_4F_8$) may be used to reduce the gaps and create the shapes shown in the figures. In this type of embodiment, merged interfaces between the microlenses are formed by the photoresist material of the microlenses merging during etch.

In the aforementioned embodiments of FIGS. 6-11, each microlens may be tuned based on the color of the pixel if desired. Each pixel has a corresponding color filter element (e.g., color filter element 104 in FIGS. 2A-2C) of a given color. The microlens group over the color filter element of the given color may be tuned based on the given color (e.g., based on the wavelengths of light transmitted by the color filter element). For example, the microlenses may be formed with different shapes, materials, refractive indices, positions, etc. based on the color of the pixel. Specifically, the location (e.g., shift relative to the microlens) and size (e.g., diameter or width) of opening 216 may be selected based on the color of the pixel. The radius of curvature of each microlens may be selected based on the color of the pixel. Asymmetric microlens shapes or asymmetric positioning of the microlenses within a given pixel may be used for the microlenses if desired.

Additionally, in the aforementioned embodiments of FIGS. 6-11, opening 216 in the center of the pixel (e.g., over inner sub-pixel group 202 in FIG. 5) may be left open or may be covered by an additional microlens. Opening 216 may have any desired shape and size.

In various embodiments, an image sensor may include an array of imaging pixels and each imaging pixel may include at least one photosensitive area, a color filter element formed over the at least one photosensitive area, and a toroidal microlens formed over the color filter element. The toroidal microlens may have an outer perimeter with a planar portion.

The planar portion may be a first planar portion and the outer perimeter may have a second planar portion, a third planar portion, and a fourth planar portion. The outer perimeter may have a first curved portion, a second curved portion, a third curved portion, and a fourth curved portion. The first curved portion may be interposed between the first and second planar portions, the second curved portion may be interposed between the second and third planar portions, the third curved portion may be interposed between the third and fourth planar portions, and the fourth curved portion may be interposed between the fourth and first planar portions.

The toroidal microlens may have an inner perimeter that defines an opening in the toroidal microlens. The opening may be a square opening. The image sensor may also include an additional microlens formed over the opening. The at least one photosensitive area may include an inner photosensitive area and an outer photosensitive area that surrounds the inner photosensitive area. The opening may overlap the inner photosensitive area. The toroidal microlens may have a first width, the planar portion may have a second width, and the second width may be between 10% and 50% of the first width.

In various embodiments, an image sensor may include an array of imaging pixels and each imaging pixel may include at least one photosensitive area, a color filter element formed over the at least one photosensitive area, a toroidal microlens formed over the color filter element, and at least one additional microlens formed on the toroidal microlens.

The at least one additional microlens may include first, second, third, and fourth additional microlenses. The first additional microlens may be formed on the toroidal microlens over a first corner of the at least photosensitive area, the second additional microlens may be formed on the toroidal microlens over a second corner of the at least photosensitive area, the third additional microlens may be formed on the toroidal microlens over a third corner of the at least photosensitive area, and the fourth additional microlens may be formed on the toroidal microlens over a fourth corner of the at least photosensitive area. The first, second, third, and fourth additional microlenses may be in direct contact with an upper surface of the toroidal microlens. The at least one photosensitive area may include an inner photosensitive area and an outer photosensitive area that surrounds the inner photosensitive area.

In various embodiments, an image sensor may include an array of imaging pixels and an imaging pixel in the array of imaging pixels may include an inner sub-pixel that includes a first photosensitive area, an outer sub-pixel that includes a second photosensitive area, a color filter element formed over the inner sub-pixel and the outer sub-pixel, and first, second, third, and fourth microlenses formed over the color filter element. An opening formed from space between the first, second, third, and fourth microlenses may overlap the inner sub-pixel.

The first microlens may be formed over a first corner of the imaging pixel, the second microlens may be formed over a second corner of the imaging pixel, the third microlens may be formed over a third corner of the imaging pixel, and the fourth microlens may be formed over a fourth corner of the imaging pixel. The first, second, third, and fourth microlenses may be in a 2×2 arrangement. The first, second, third, and fourth microlenses may each be shifted away from a center of the inner sub-pixel. The outer sub-pixel may include the second photosensitive area and a third photosensitive area, the second photosensitive area may be overlapped by the first and second microlenses, and the third photosensitive area may be overlapped by the third and fourth microlenses.

The foregoing is merely illustrative of the principles of this invention and various modifications can be made by those skilled in the art without departing from the scope and spirit of the invention.

What is claimed is:

1. An image sensor comprising an array of imaging pixels, wherein an imaging pixel in the array of imaging pixels comprises:
   at least one photosensitive area;
   a color filter element formed over the at least one photosensitive area; and
   a toroidal microlens formed over the color filter element, wherein the toroidal microlens has an outer perimeter with a planar portion, wherein the toroidal microlens has a first width, wherein the planar portion has a second width, and wherein the second width is between 10% and 50% of the first width.

2. The image sensor defined in claim 1, wherein the planar portion is a first planar portion and wherein the outer perimeter has a second planar portion, a third planar portion, and a fourth planar portion.

3. The image sensor defined in claim 2, wherein the outer perimeter has a first curved portion, a second curved portion, a third curved portion, and a fourth curved portion.

4. The image sensor defined in claim 3, wherein the first curved portion is interposed between the first and second planar portions, wherein the second curved portion is interposed between the second and third planar portions, wherein the third curved portion is interposed between the third and fourth planar portions, and wherein the fourth curved portion is interposed between the fourth and first planar portions.

5. The image sensor defined in claim 1, wherein the toroidal microlens has an inner perimeter that defines an opening in the toroidal microlens.

6. The image sensor defined in claim 5, wherein the opening is a square opening.

7. The image sensor defined in claim 5, further comprising:
   an additional microlens formed over the opening.

8. The image sensor defined in claim 5, wherein the at least one photosensitive area comprises an inner photosensitive area and an outer photosensitive area that surrounds the inner photosensitive area.

9. The image sensor defined in claim 8, wherein the opening overlaps the inner photosensitive area.

10. An image sensor comprising an array of imaging pixels, wherein an imaging pixel in the array of imaging pixels comprises:
    at least one photosensitive area;
    a color filter element formed over the at least one photosensitive area;
    a toroidal microlens formed over the color filter element; and
    at least one additional microlens formed on the toroidal microlens.

11. The image sensor defined in claim 10, wherein the at least one additional microlens comprises first, second, third, and fourth additional microlenses.

12. The image sensor defined in claim 11, wherein the first additional microlens is formed on the toroidal microlens over a first corner of the at least photosensitive area, wherein the second additional microlens is formed on the toroidal microlens over a second corner of the at least photosensitive area, wherein the third additional microlens is formed on the toroidal microlens over a third corner of the at least photosensitive area, and wherein the fourth additional microlens is formed on the toroidal microlens over a fourth corner of the at least photosensitive area.

13. The image sensor defined in claim 11, wherein the first, second, third, and fourth additional microlenses are in direct contact with an upper surface of the toroidal microlens.

14. The image sensor defined in claim 10, wherein the at least one photosensitive area comprises an inner photosensitive area and an outer photosensitive area that surrounds the inner photosensitive area.

15. An image sensor comprising an array of imaging pixels, wherein an imaging pixel in the array of imaging pixels comprises:
    an inner sub-pixel that includes a first photosensitive area;
    an outer sub-pixel that includes a second photosensitive area;
    a color filter element formed over the inner sub-pixel and the outer sub-pixel; and
    first, second, third, and fourth microlenses formed over the color filter element, wherein an opening formed from space between the first, second, third, and fourth microlenses overlaps the inner sub-pixel.

16. The image sensor defined in claim 15, wherein the first microlens is formed over a first corner of the imaging pixel, wherein the second microlens is formed over a second corner of the imaging pixel, wherein the third microlens is formed over a third corner of the imaging pixel, and wherein the fourth microlens is formed over a fourth corner of the imaging pixel.

17. The image sensor defined in claim 15, wherein the first, second, third, and fourth microlenses are in a 2×2 arrangement.

18. The image sensor defined in claim 15, wherein the first, second, third, and fourth microlenses are each shifted away from a center of the inner sub-pixel.

19. The image sensor defined in claim 15, wherein the outer sub-pixel includes the second photosensitive area and a third photosensitive area, wherein the second photosensitive area is overlapped by the first and second microlenses, and wherein the third photosensitive area is overlapped by the third and fourth microlenses.

* * * * *